United States Patent [19]
Bolyn

[11] Patent Number: 6,092,165
[45] Date of Patent: Jul. 18, 2000

[54] MEMORY CONTROL UNIT USING A PROGRAMMABLE SHIFT REGISTER FOR GENERATING TIMED CONTROL SIGNALS

[75] Inventor: Philip C. Bolyn, Norristown, Pa.

[73] Assignee: Unisys Corporation, Blue Bell, Pa.

[21] Appl. No.: 08/699,022

[22] Filed: Aug. 16, 1996

[51] Int. Cl.[7] .................................................. G06F 13/14
[52] U.S. Cl. .............................. 711/167; 711/170; 711/5; 711/105; 711/109
[58] Field of Search ..................................... 711/167, 154, 711/5, 109, 170, 105; 365/233

[56] References Cited

U.S. PATENT DOCUMENTS

| | | | |
|---|---|---|---|
| 5,179,686 | 1/1993 | White | 711/118 |
| 5,301,278 | 4/1994 | Bowater et al. | 711/5 |
| 5,307,320 | 4/1994 | Farrer et al. | 365/230.01 |
| 5,335,337 | 8/1994 | Gagliardo et al. | 395/500 |
| 5,418,924 | 5/1995 | Dresser | 711/167 |
| 5,455,957 | 10/1995 | Pawlowski et al. | 395/309 |
| 5,610,864 | 3/1997 | Manning | 365/193 |
| 5,778,413 | 7/1998 | Stevens et al. | 711/5 |

OTHER PUBLICATIONS

"Chips: Intel Corp. Intros Higher Peforming PCI Chip Set for Pentium Processors; Triton Architecture Unlocks Pentium Processor Power Necessary for Multitude of Applications. (Intel Corp's 8243Fx)", EDGE: Work–Group Computing Report, v6, n246, p10(1), Feb. 6, 1995.

"Intel 430MX PCI Set 82437MX Mobile System Controller (MTSC) and 82438MX Mobile Data Path (MTDP)" Intel Corp. pp. 1–70, Apr. 1996.

"Intel 430VX PCI Set 82437VX System Controller (TVX) and 82438VX Data Path Unit (TDX)", Intel Corp. pp. 1–90, Jul. 1996.

*Primary Examiner*—Eddie P. Chan
*Assistant Examiner*—Hong Kim
*Attorney, Agent, or Firm*—Steven B. Samuels; Mark T. Starr; Rocco L. Adornato

[57] ABSTRACT

A programmable memory controller is described. The memory control signals and timings are defined by programmable means. A plurality of shift registers are loaded with programmed values at the start of a control sequence. The programmed values are synchronously shifted with the optimum value system clock to thereby generate a plurality of memory control signals. Each memory control signal is generated by a shift register. Depending on the mode of operation to be performed by the memory device, different programmed values are loaded into the plurality of shift registers at the start of a control sequence. The selection of which programmed value to be loaded into the plurality of shift registers is accomplished by a multiplexer device coupled with each shift register. The multiplexer device selects one input mode register containing programmed values. One input mode register exists for each mode of operation that can be performed by the memory device. The selected mode registers are loaded into each shift register to generate the desired control sequence for the memory device.

22 Claims, 5 Drawing Sheets

MEMORY CONTROL UNIT USING A PROGRAMMABLE SHIFT REGISTER FOR GENERATING TIMED CONTROL SIGNALS

BACKGROUND OF THE INVENTION

1. Field of the Invention

The present invention relates generally to computer systems, and more particularly to a programmable memory controller used to control a diverse variety of memory devices in a diverse variety of computer systems.

2. Related Art

The two most common types of semiconductor random access memories (RAMs) used in modern computer systems are static random access memory (SRAM), and dynamic random access memory (DRAM). Typically DRAMs are most often used when large amounts of memory are required, such as for an implementation of a computer system's primary storage.

DRAMs are most often implemented when large amounts of memory are needed due to their lower costs and space requirements compared to SRAMs. However, the use of DRAMs require more complicated support circuitry than SRAMs. SRAMs store bits of data in an array of flip-flops. Once a bit is written in a SRAM, it remains there until it is either changed by another write sequence or energy is removed from the memory circuit.

DRAMs, on the other hand, store bits of data as charged capacitors. Because DRAMs typically are implemented using only a single transistor per bit of storage, they can be fabricated much more densely than SRAMs which typically require from 4-6 transistors per bit. However, because DRAMs store bits of data as charges, they are unstable because the charges leak off in a very short amount of time, usually within a few milliseconds. Thus, if DRAMs are not continuously attended to by a procedure known as 'refresh' they are subject to memory loss.

Refresh is accomplished by accessing the data within each cell in a DRAM. DRAM chips are generally organized in a matrix having rows and columns. In order to effectively perform refresh operations without taking an inordinate amount of time by continuously reading and writing to each cell every couple of milliseconds, DRAMs are organized so that an entire row may be refreshed during a single operation. This feature dramatically decreases the amount of time spent on refresh cycles.

Additionally, the row/column organization of DRAMs facilitates the use of fewer address lines that need to be connected to each DRAM chip. Each memory location within a DRAM is addressed by specifying a particular row address and a particular column address. The intersection of a row and column address identifies a specific memory location. By time multiplexing the row address and the column addresses, the same address lines can be used for both components of the address, thereby reducing the number of required address lines.

For example a DRAM chip that has a capacity of 64 Mbits may be arranged as a matrix comprising 8192 columns and 8192 rows. Generally, in order to address 64 Mbits of data using linear addressing techniques, 26 address lines are required. However, by time multiplexing the row and column address (i.e. by presenting the row address, followed by the column address), only 13 address lines are required.

In order to handle the refresh, address multiplexing, and other stringent control and timing requirements of DRAMS (discussed below), complex support circuitry is required. This is to be contrasted with the relatively simple support circuitry required by SRAMs. However, such complex support circuitry can be shared among large arrays of DRAMs making the additional cost less significant for systems that employ large memory arrays. Indeed, for systems that employ large memory arrays, the savings realized in both semiconductor real estate and lower memory costs generally outweigh the additional expense associated with the complex support circuitry.

Thus, computer system design engineers that wish to use DRAMs in their system designs must supply the required DRAM support circuitry. Generally, DRAM manufactures provide specifications for each type of DRAM they produce. Such specifications comprise information needed to support each operating mode of the DRAM Frequently, the specifications include timing diagrams comprising a plurality of digital waveforms. Each timing diagram depicts the control signals and their associated timings that are required to support each mode of operation of the DRAM. Typically, DRAMs support at least three modes of operation: a read, a write, and a refresh. A typical read cycle sequence can involve more than 20 timing parameters, all of which must be held within the specified limits to insure a proper read operations. Write and refresh cycle timings are similarly complex.

Conventional methods used by design engineers to support such requirements typically involve the use of commercial off-the-shelf (COTS) support chips. Generally, such COTS support chips are specifically designed for use with particular DRAMs. Alternatively, custom support chips such as application specific integrated circuit chips (ASICs) can be designed and used with particular circuit boards.

The problem with using the conventional methods, is that such support chips are generally fixed in terms of their control signals and timings. Typically, conventional support chips are designed to rigidly adhere to the control timings specified by the manufacturer of a particular type of DRAM. In addition to being designed to work only with particular types of DRAMs, customized support chips may also be designed to work only with particular circuit boards characteristics.

In either case, the control signals and timings generally unalterable, except -for small variations that can be made on the circuit board level. Such variations are typically achieved using external circuitry such as drivers and/or delay circuits which compensate for such circuit board level irregularities, such as long propagation delays and the like.

Some DRAM controller chips do have limited programming capabilities. However, such capabilities generally allow one to stretch or compress control signal sequences and do not allow one to alter the waveform associated with a particular control signal. For example, a certain number of cycle delays of certain control signals (with respect to other signals) can be programmed into such controller chips. However, the shape of the waveforms themselves generally remain fixed and unalterable.

Thus, in general, conventional support circuitry used to support DRAMs are very closely tied to particular system designs. When changes are made to the system designs, new support chips with different control and timing parameters are generally also required. Such changes to system designs include altering the frequency of the system clock, using different types of DRAM, using different DRAM modes of operations, and other changes causing increased or decreased circuit board propagation, such as adding additional memory and the like.

Consequently, different support circuitry is generally implemented in different computer systems. Even computer manufacturers that produce a line of computer system having similar characteristics often need to use different support circuitry in each system. For example, at the high end of a product line, faster processors and larger memory arrays are typically used. Conversely, at the low end of a product line, slower processors and smaller memory arrays are used. Products that fall in between such high and low ends use processors of various speeds and/or various sized memory arrays. As stated, changes to system clock speeds and/or changes to the memory size and circuit board layouts, typically affect the timings of the memory support circuitry. Thus, each system in a product line, typically requires a unique and/or custom support circuitry. This can add substantially to the cost of such systems and can also increase development cycle times.

SUMMARY OF THE INVENTION

Accordingly, the present invention is directed toward a programmable memory controller device. The same programmable memory controller device may be used with a wide range of computer systems and designs. All control signals, control signal timings and their interrelationships are defined by programmable means. Further, when design changes are made to computer systems, the same programmable memory controller device may be used by simply altering the program parameters provided by an embodiment of the present invention. The program parameters define all aspects of the control signal waveforms generated by an embodiment of the present invention.

Variations and changes to computer systems include for example implementing new memory devices having different specifications. Other variations and changes include adding support for new modes of memory operations such as EDO page mode, synchronous DRAM modes, burst mode, or future modes not yet identified. Additionally, variations and design changes include changes to system timings such as those that occur by changing the frequency of the system clock. Embodiments of the present invention can also be used to compensate for board level variations such as propagation delays due to different sized memory systems, alternate circuit board layouts and the like.

A preferred embodiment of the present invention is implemented with an application specific integrated circuit (ASIC) chip. The ASIC comprises a progrmmable means for defining the specifications for each output control signal driven by the memory controller. The programmable means specifies the digital patterns, timings and interrelationships of the output control signals.

A plurality of shift registers are provided within the ASIC. Each output control signal corresponds to one shift register within the ASIC. The shift registers are loaded with programmable values that are synchronously shifted with the system clock into the registers to generate digital output waveforms that form the control signals driven from the output pins of the ASIC. Depending on the particular mode of operation that is to be performed with the memory device, a particular programmed value corresponding with that mode of operation is loaded into each shift register.

For example, a typical DRAM memory controller performs three modes of operations, namely a read, a write and a refresh. Thus, in this example, each shift register may be loaded with one of three values depending on which mode of operation is to be performed. The selection of which value to load into each shift register is accomplished with the use of a multiplexer device that is coupled with each shift register. The multiplexer device selects one input mode register from a plurality of input mode registers, each representing one mode of operation. The selected input mode register then gets loaded into the shift register so that the appropriate mode of operation sequence is generated.

BRIEF DESCRIPTION OF THE FIGURES

The present invention will be described with reference to the accompanying drawings, wherein.

In the drawings, like reference numbers generally indicate identical, functionally similar, and/or structurally similar elements. The drawing in which an element first appears is indicated by the leftmost digit(s) in the reference number.

DETAILED DESCRIPTION OF THE PREFERRED EMBODIMENTS

The present invention is directed toward a programmable memory controller that can be used with a wide range of computer system designs. The control signals, control signal timings, and their interrelationships are all defined by programmable means. This allows a single memory controller to be used with a wide range of computer systems.

In a preferred embodiment of the present invention the programmable memory controller is implemented with an application specific integrated circuit (ASIC) chip. The ASIC comprises a programmable means for defining the specifications for each output control signal driven by the memory controller. The programmable means specifies the digital patterns, timings and interrelationships of the output control signals generated by the memory controller.

The examples provided herein describe a preferred embodiment of the present invention as it relates to the control of a DRAM device. However, an embodiment of the present invention may be implemented with many types of memory devices including without limitation, static random access memory (SRAM), video memory (VRAM, three-dimensional random access memory (3DDRAM), synchronous dynamic random access memory (SDRAM), Windows random access memory (WRAM), Cache DRAM, Mulit-bank DRAM, and other memory devices not yet conceived.

Figure 1:
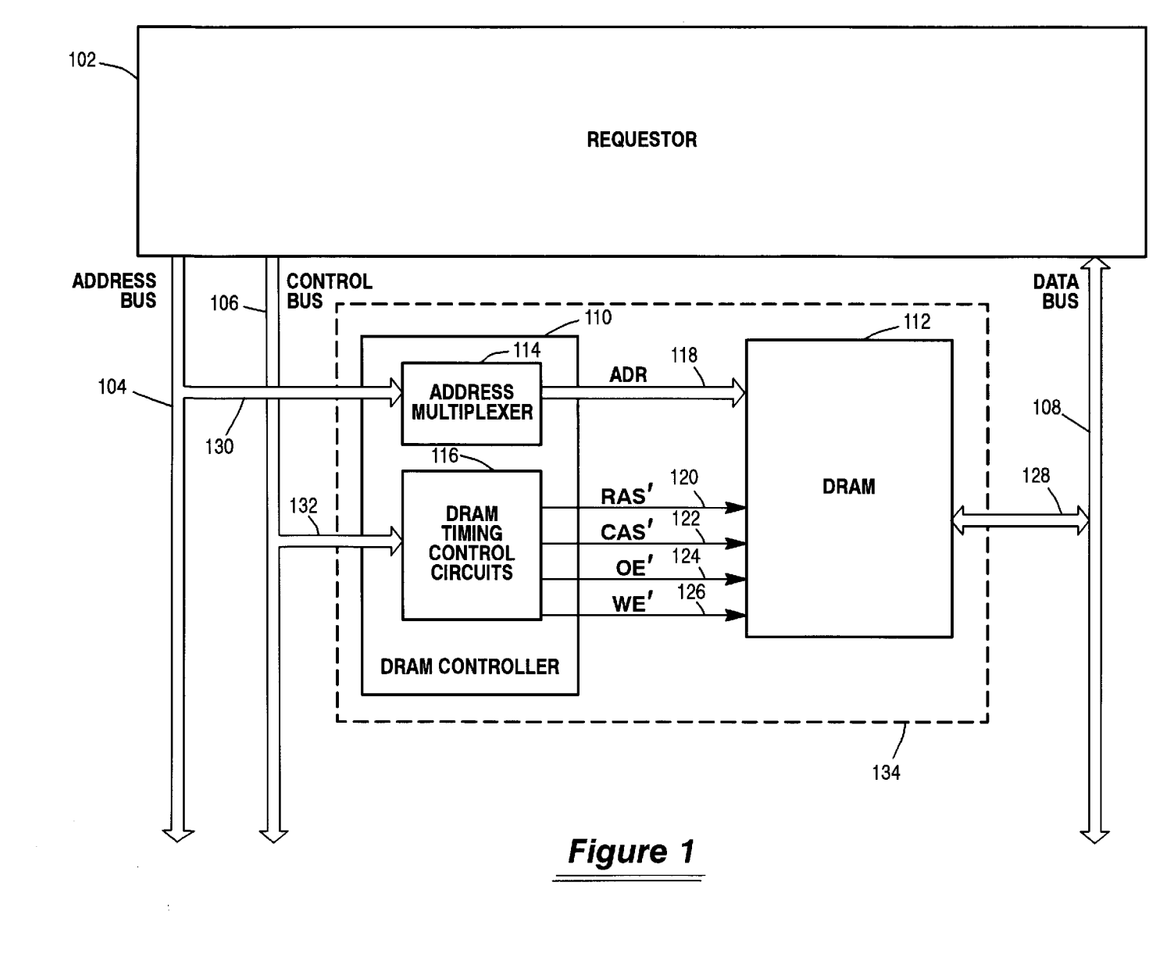
FIG. 1 is a block diagram depicting a typical operating environment for the present invention.

FIG. 1 is a block diagram depicting a typical operating environment for the present invention. FIG. 1. shows a requestor 102, a DRAM controller 110 and a DRAM 112. The requestor 102 can be any device that can interface with the DRAM controller 110 and request memory read and write operations therefrom. Such examples of requesters are central processing units (CPUs), direct memory access (DMA) devices, second level cache devices and input/output (I/O) channel devices. Further the requestor depicted as the block 102 can represent one or a plurality of requesters. The requester 102 comprises a control bus 106, an address bus 104 and a data bus 108. The DRAM controller acts as an interface between the DRAM 112 and the requestor. Note that as depicted in FIG. 1, a plurality of DRAMs 112 can be coupled with a single DRAM controller 110. Also note that a plurality of such DRAM controller/DRAM(s) combinations 134, may be coupled with the requestor via the address bus 104, the control bus 106 and the data bus 108, as shown.

Each DRAM controller 110 comprises two components: an address multiplexer 114 and a DRAM timing control circuit 116. The address multiplexer 114 is coupled with the requestor's address bus 104 via the address bus 130. The address multiplexer 114 typically converts an address originating from the requester, into a time-multiplexed row and column address required by the DRAM 112. The time-multiplexed row and column address are sent to the DRAM 112 via the address bus 118.

Note that as previously stated, the address bus 118 required for DRAMs is typically at most, half as wide as the requestors address bus 104 and the DRAM input address bus 130. For example, a typical implementation of a computer system having 64 Mbytes of DRAM, generally requires an address bus that is at least 26 bits wide. That is, a minimum of 26 binary digits are required to represent 6,5536,000 individual address locations. In some implementations additional address lines are also used for controlling DRAMs. For example, in systems that employ particularly large memory arrays, additional address lines are used to select between a plurality of DRAM blocks, where each block contains 64 Mbytes of DRAM. For example, 3 address lines can be added to select between a maximum of 8 such blocks. Thus, in this example, the address busses 104 and 130 would be 29 bits wide.

However, still only 13 lines are required for the address bus 118 when using the previously described time-multiplexing technique. Thus, in this example, the address bus 118 would be 13 bits wide, while address busses 130 and 104 would be 29 bits wide. This savings is considerable when considering that a single DRAM controller 110 typically controls a plurality of DRAM chips 112.

Memory read and memory write requests are made by the requestor 102 via the control bus 106. The DRAM controller 110 responds to such requests by generating the appropriate control signals and the appropriate timings for such control signals to the DRAM 112. The data pertaining to a memory write is sent from the requestor 102 to the DRAM 112 via the bidirectional data busses 108 and 128 respectively. Likewise the data pertaining to the memory read is sent from the DRAM 112 to the requestor 102 the via the bidirectional data busses 128 and 108 respectively. Generally, the DRAM controller 110 also controls and generates periodic refresh cycles as required by the DRAM 112. Arbitration between read and write requests and such refresh operations are also typically managed by the DRAM controller 110.

Figure 2:
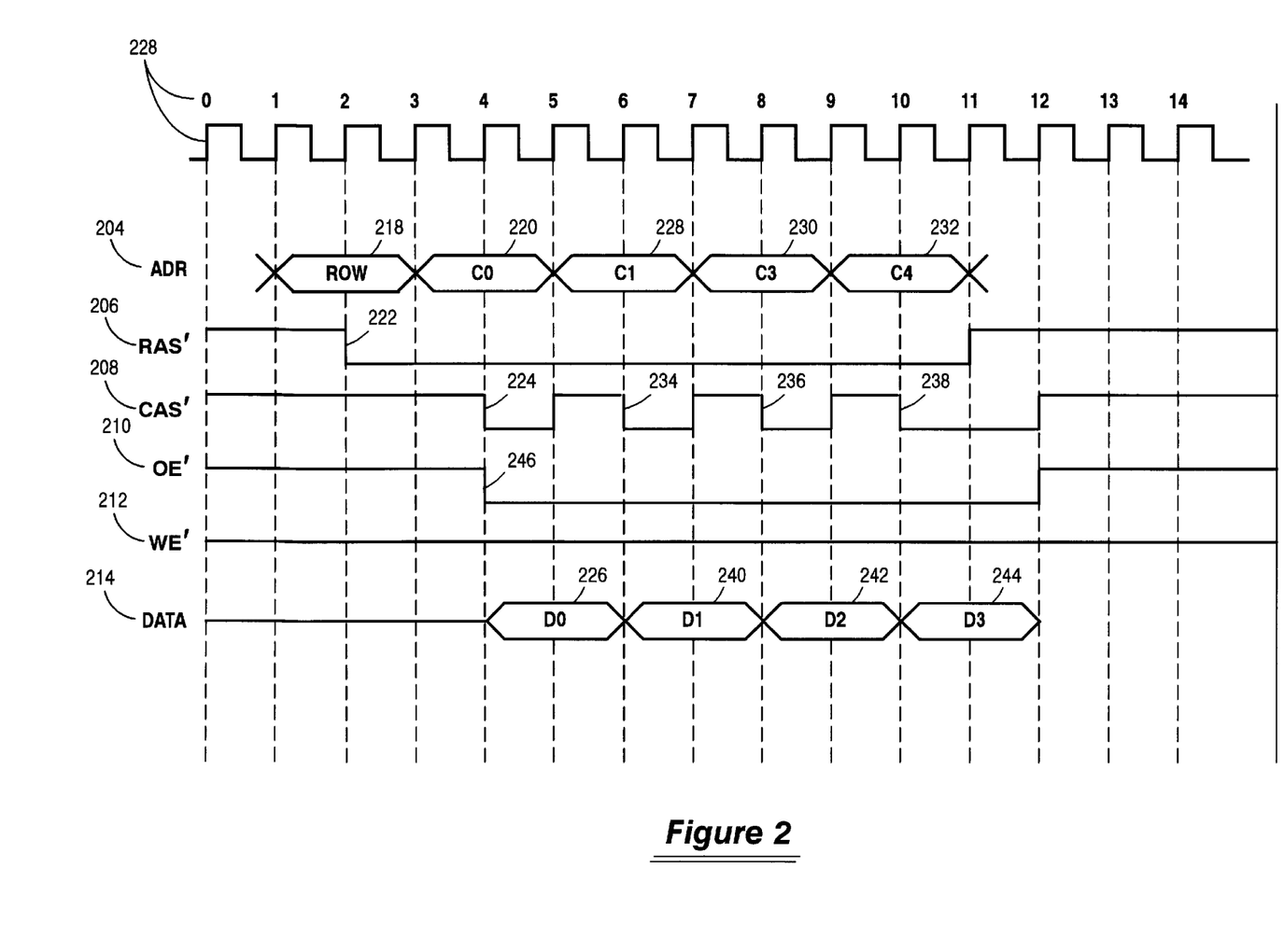
FIG. 2 is a typical timing diagram depicting a nominal read control sequence for a DRAM device.

The output signals from the DRAM controller 110, specifically the signals on the address bus 118, the RAS' line 120, the CAS' line 122, the OE' line 124 and the WE' line 126, will be described with reference to the timing diagram in FIG. 2. The timing diagram in FIG. 2 depicts timing relationships for a typical DRAM read operation. In this case, the read operation depicted is a 4 word page mode read request, which is a common type of read request supported for example, by COTS extended data out (EDO) DRAMS. In this mode of operation, 4 data words stored within a common row are accessed by specifying a single row address followed by 4 successive column addressess. The single row address, coupled with each of the 4 column addresses comprises 4 distinct row/column addresses. Because the row address is only specified once, the time to read 4 words of data is substantially decreased.

Note that the timing diagram in FIG. 2 is used to show typical requirements related to the control line interrelationships and the types of timing constraints generally provided by memory controlling devices. Other modes of operation, such as write or refresh modes could have been used to convey the principles depicted herein. Accordingly, the read operation used throughout the instant disclosure is used as an example in order to distinctly point out the features and functions provided by an preferred embodiment of the present invention. The same principles apply to other modes of operation such as different types of read modes, write modes and refresh modes.

The timing diagram depicted in FIG. 2 is a typical timing diagram displaying nominal timings and relationships for the control signals for a DRAM device. The control signals are depicted as horizontal waveforms and are labeled at the beginning of each waveform, on the left side of the timing diagram. The numbers across the top of the timing diagram are time reference points that represent successive system clock pulses 228 in the controller 110. In this example, 15 clock pulses are depicted that range from clock pulse 0 to clock pulse 14 (see the numbers to the right of the reference numeral 228). Note that when a particular clock pulse is referenced herein, it is hereinafter referred to as clock pulse 228-n, where n represents one of the numbers, 0–14, as depicted across the top row of the timing diagram 228. For example, the transition 222 of the RAS' waveform 206 occurs at the rising edge clock pulse 228-2. Note that the "'" symbol at the end of a waveform signal name, such as RAS' 206, indicates that the associated signal is active upon a low logic level low active.

The timing relationships required for a typical DRAM will now be described. The DRAM 112 latches the row address 218 upon the falling edge of the row address strobe (RAS') 222. Thus, during the clock pulse 228-2, when the DRAM controller 110 generates the falling edge 222 of the RAS' signal 206, the address multiplexer 114 must contemporaneously supply the DRAM 112 with the appropriate row address 218, corresponding with the read request generated by the requester 102. The row address 218 is transmitted to the DRAM over the address bus 118.

Typically the row address 218 is a translated output originating from the address multiplexer 114 of the DRAM controller 110. As previously stated, the address multiplexer 114 translates an address that comprises the full width of the address busses 104 and 130. Each full length address is translated into separate row and column address, which are time multiplexed to the DRAM chips 112, as can be seen by the row and column address signals 218 and 220. Note that as previously stated, each row and column address comprises the width of the smaller address bus 118. This method of row/column addressing reduces the number of address lines (typically by half) attached to each DRAM chip. The larger address busses 130 are attached only to each of the DRAM controller chips 110, which are typically much less plentiful than the plurality of DRAM chips comprising a typical computer system having large memory arrays.

Referring back to FIG. 2, the next event occurs at the clock pulse 228-4. At clock pulse 228-4, the column address strobe (CAS') 208 transitions to a low logic level 224. This event causes the DRAM 112 to latch-in the column address 220 via the address-bus 118. Thus, during the clock pulse 228-4, when the DRAM controller 110 generates the falling edge 224 of the CAS' signal 208, the address multiplexer 114 must contemporaneously supply the DRAM 112 with a valid column address 220, corresponding the CPU's 102 read request.

At the same time, during clock pulse 228-4, the output enable (OF') signal 210 transitions to a low logic state 246, causing the DRAM 112 to turn on its output drivers. The data stored in the memory location identified by the row/column addresses 218/220 now appears on the data bus 128. Thus, the data DO 226 is now available for the requestor 102 to read via the data bus 108.

Next at the clock pulse 228-6, the CAS' signal 208 once again goes low 234. This causes the DRAM 112 to latch-in the second column address 228. At this time the OE' signal 210 remains low and the DRAM turns on its output drivers. This causes the data stored in the memory location identified by the row/column address 218/228 address to appear on the data bus 128. At this point the data D1 240 is available for the requestor 102 to read via the data bus 108.

Next at the clock pulse 228-8, the CAS' signal 208 goes low 236, causing the DRAM 112 to latch-in the column address 230. At this time the OE' signal 210 remains low and the DRAM turns on its output drivers so that data from the row/column address 218/230 address is output to the data bus 128. At this point the data D2 242 is available for the requestor 102 to read via the data bus 108.

Finally, at the clock pulse 228-10, the CAS' signal 238 goes low, causing the DRAM 112 to latch-in the column address 232. At this time the OE' signal 210 remains low and the DRAM turns on its output drivers so that data from the row/column address 218/232 address is output to the data bus 128. At this point the data D3 244 is available for the requestor 102 to read via the data bus 108. Note a read operation is depicted in FIG. 2, the write enable (WE') signal 212 remains high throughout the entire read sequence.

Thus, as can be seen by this relatively simple example, a plurality of specific events must occur within the very specific and rigid time limits in order to achieve a successful read operation. The same is true for other modes of operations (not shown) which have their own associated timing diagrams depicting for example, write and refresh cycles. Note that for a typical system which operates at a system clock speed of 50 Megahertz (50 MHZ.), each clock pulse 228 represents an elapsed time of 20 nanoseconds (20 ns.).

Figure 3:
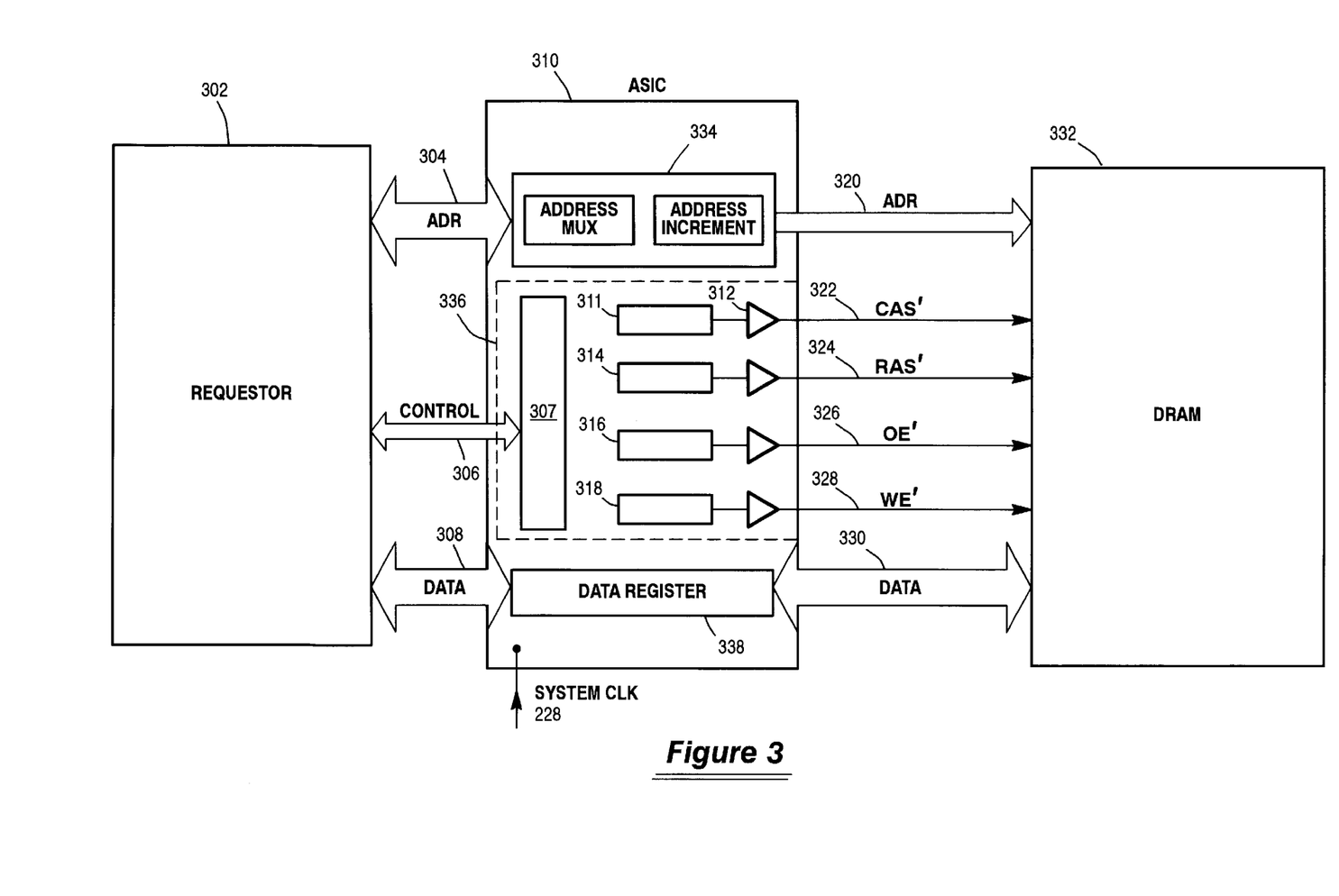
FIG. 3 is a block diagram depicting a typical operating environment including a preferred embodiment of the present invention.

FIG. 3 is a block diagram depicting a typical operating environment including a preferred embodiment of the present invention. A preferred embodiment of the present invention is implemented using an ASIC device. Accordingly, the examples presented herein refers to an embodiment of the present invention as the ASIC 310. The ASIC 310 acts as an interface between the DRAM 332 and the requestor 302. Note that a typical computer system may comprise one or more ASICs 310. Additionally, a plurality of DRAMs, such as DRAM 332 are typically connected to each ASIC 310. Finally, multiple requestors 302 can be coupled with one or more ASICs 310.

The ASIC 310 as depicted in FIG. 3 is functionally divided into three components: the address controller component 334; the control signal component 336; and the data controller component 338. The functions provided by each of these three components 334, 336, and 338 are described below.

The control signal component 336 is provided with the system clock 228 and provides the programmable output control signals that are transmitted across each of the control lines 322, 324, 326 and 328. Each output control line, the CAS' line 322, the RAS' line 324, the OE line 326 and the WE' line 328, has an associated waveform generator 311, 314, 316 and 318, respectively. Each waveform generator 311, 314, 316 and 318 is controlled by a controller 307 (described below). In addition, each waveform generator 311, 314,316 and 318 is coupled with a signal driver, such as the signal drive 312. Such signal drivers are used to drive or transmit the output signals generated by each waveform generator 311, 314, 316 over the corresponding control lines 322, 324, 325 and 328.

In order to describe how each of these waveform generators (311, 314, 316, and 316) function, an example is used which describes how the CAS' waveform is generated by the waveform generator 311. All other waveform generators, such as the waveform generators 314, 316, and 318 function in a similar fashion. Further, additional or fewer signal generators may be used in various embodiments of the present invention depending on the memory device requirements. In addition, a particular embodiment of the present invention can be used with various types of memory devices simply by altering the programming (described below), and by selecting one or more of the available control lines that are supplied by the particular embodiment of the present invention. Thus, the examples are used herein in order to distinctly point out the principles of the present invention and should not be construed as limitations to the scope and breadth of the present invention.

Figure 5:
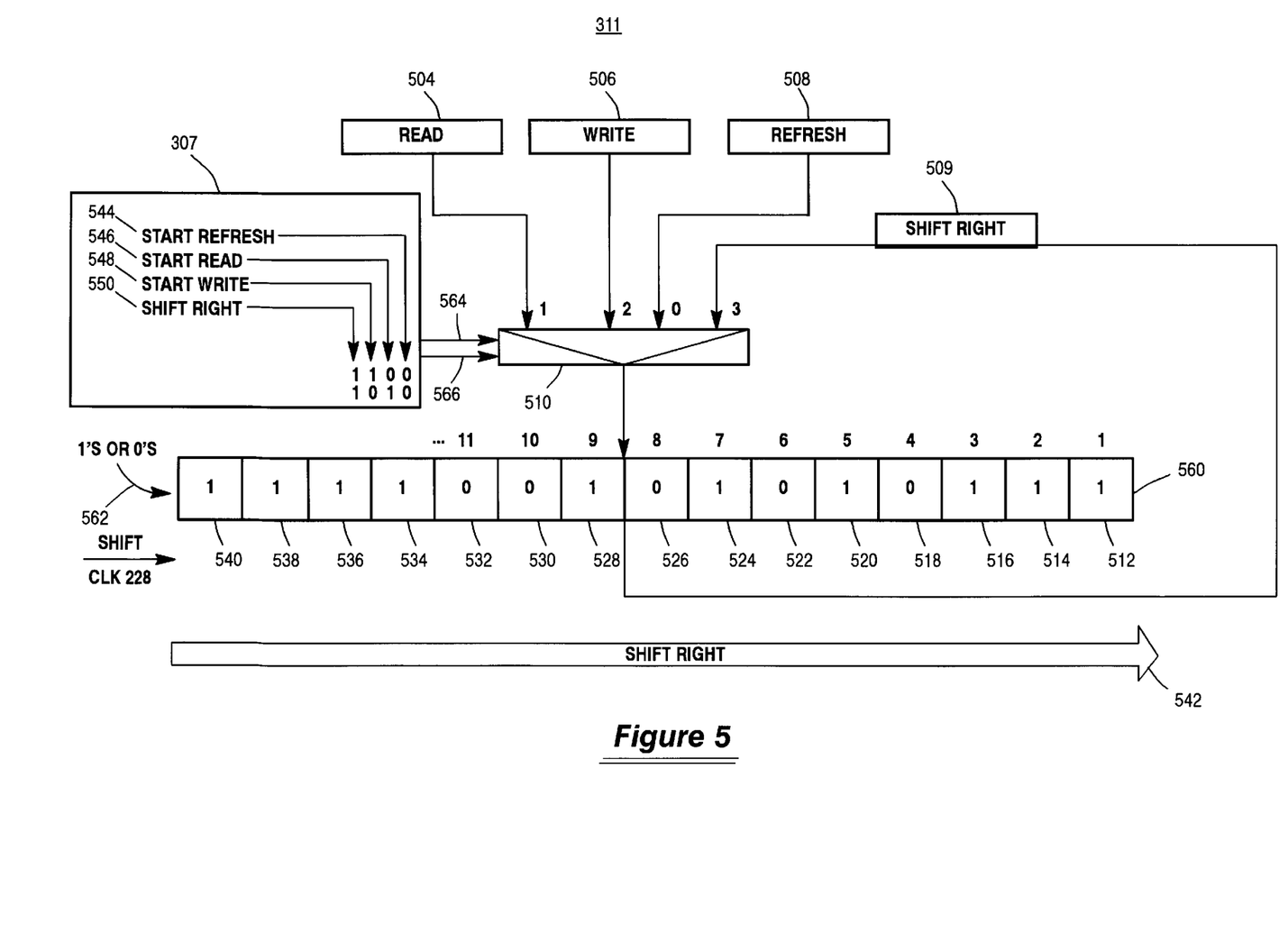
FIG. 5 is a block diagram depicting a waveform generator according to a preferred embodiment of the present invention.

Referring to FIG. 5, the CAS' waveform generator 311 comprises a multiplexer 510 and a shift register 560. A controller 307 provides values to the control inputs 564 and 566 to control the mode of operation of the shift register 560. This is depicted in FIG. 5 by the 4 input devices 504, 506, 508, and 509. Depending on the desired mode of operation, the controller 307 supplies a different value to the control inputs 564 and 566, causing one of the 4 inputs 504, 506, 508 or 509 to be gated by the multiplexer 510 into the shift register 560. As will be described below, the first three inputs 504, 506, and 508 represent a mode of operation where the value within one of the three registers, the read register 504, the write register 506 or the refresh register 508 is loaded into the shift register 560. The shift right input 509 represents a mode of operation where the value within the shift register 560 is shifted to the right. In addition, a new value of '1' or '0' will be added to the leftmost bit position, as will be described below. This function is depicted by the input 509 which originates from the shift register 560. Note that various methods may be used to implement the shift register modes of operation as disclosed herein, and such methods will be apparent to those skilled in the relevant art(s).

Note that the numbers that appear next to the input arrow heads depicted for the inputs 504, 506, 508 and 509 represent the control values (as depicted by 544, 546, 548 and 550) used in this example to gate the corresponding input into the shift register 560. The shift register 560 performs two modes of operations, namely a load operation and a shift operation. As depicted by the arrow 542 the shift operation mode in this example, shifts the values in the shift register to the right. Typically the shifting takes place synchronously with the system clock. Thus, upon each pulse of the system clock, the value in each bit position shifts one bit position to the right. For example, the value in the second bit position 514 is shifted to the first bit position 512. The value in the first bit position 512 is shifted to the output driver 312, thereby generating the CAS' digital waveform that is transmitted over the CAS' output control line 322.

In this example, while the shifting operation is taking place, a shift value of 1 is supplied to the shift register 560 in the leftmost bit position 540, during each pulse of the system clock. In other cases the shift value will be 0 (as indicated by the arrow 562). The choice of whether to uses 1's or 0's for the shift value, depends upon whether the output control signal is an active high or an active low signal. In general, for active low control signals, a shift value of 1 is used, and for active high control signals a shift value of 0 is used. Alternatively, inverters can be used to invert the logic. For example, if an inverter were to be used in the output signal path for all low active control signals, 0's can be used as the shift value for all shift registers, regardless of whether the associated signal is active high or low. It should be appreciated that such inverters can be supplied at various locations, and can be implemented in either in hardware or software. For example a hardware type inverter can be coupled with the output driver 312. Also note that if an inverter is used in this fashion for a particular control signal, the programmed values that are loaded into the shift register (as described below), will be inverted as well. For simplicity, in the examples discussed herein, it is assumed that such inverters are not used in the preceding fashion.

Thus, in the example in FIG. 5, since CAS' is a low active control signal, a shift value of 1 is supplied to the leftmost bit position 540, as depicted by bit positions 534, 536, 538 and 540. Consequently, after the desired programmed digital waveform is shifted out (discussed below), the signal generated by the plurality of 1's at 562, merely forms a steady state high waveform which corresponds to the inactive state for the CAS' signal. Conversely, for high active signals, after the desired programmed digital waveform is shifted out, the signal generated by the plurality of 0's at 562, merely form a steady state low waveform which corresponds to the inactive state for high active signals.

The second process that can be performed by the shift register 560 is the load process. During the load process one of programmable values which are stored in the read, write and refresh registers (504, 506 and 508 respectively), is loaded into the shift register 560, preferably in a parallel fashion. As stated, control over the operation of the shift register 560 is performed by the controller 307, through the use of the control lines 564 and 566.

Thus, the value that the controller 307 supplies to the control lines 564 and 566 defines the mode of operation of the shift register 560. In this example, if a value of '00', '01' or '10' appear on the control lines 564 and 566, a load operation is performed with one of the three mode registers 504, 506 or 508. Accordingly, the programmable value contained in either the refresh register 508, the read register 504, or the write register 506 is parallel loaded into the shift register 560. Typically, immediately following a load register operation, a value of '11' is provided to the control lines 564 and 566 causing the shift register to continuously shift right thereby generating the waveforms defined by the values in the shift register 560, as previously described. The shift mode will typically continue until another load register operation is performed.

Thus, when the shift register 560 is not loading in a new value from one of the registers 504, 506, or 508, it is typically in the shift right mode of operation. The logic for the controller 307 that controls the mode of operation of the shift register 560 is typically supplied by the ASIC 310, and will be apparent to those skilled in the relevant art(s). In addition, like conventional DRAM memory controllers, the ASIC 310 provides means for refreshing the DRAMs 322. Thus when the ASIC determines a refresh cycle is to be performed, it generates a Start Refresh control signal 544 to initiate a refresh cycle.

Although the Start Read 546 and the Start Write 548 signals are also internally generated by the ASIC 310, such requests originate from a read or write memory request from the requestor 302. The purpose of the Start Read 546, Start Write 548, and Start Refresh 544 control signals is to initiate a memory controller timing sequence, such as the read sequence depicted in FIG. 4. This is accomplished by loading each of the ASIC shift registers located within each of the signal generators 311, 314, 316 and 318 with a programmable value (described below). Each programmable value from the plurality of shift registers is synchronously shifted with the system clock to thereby generate a complete control timing sequence, such as depicted in FIG. 4.

Figure 4:
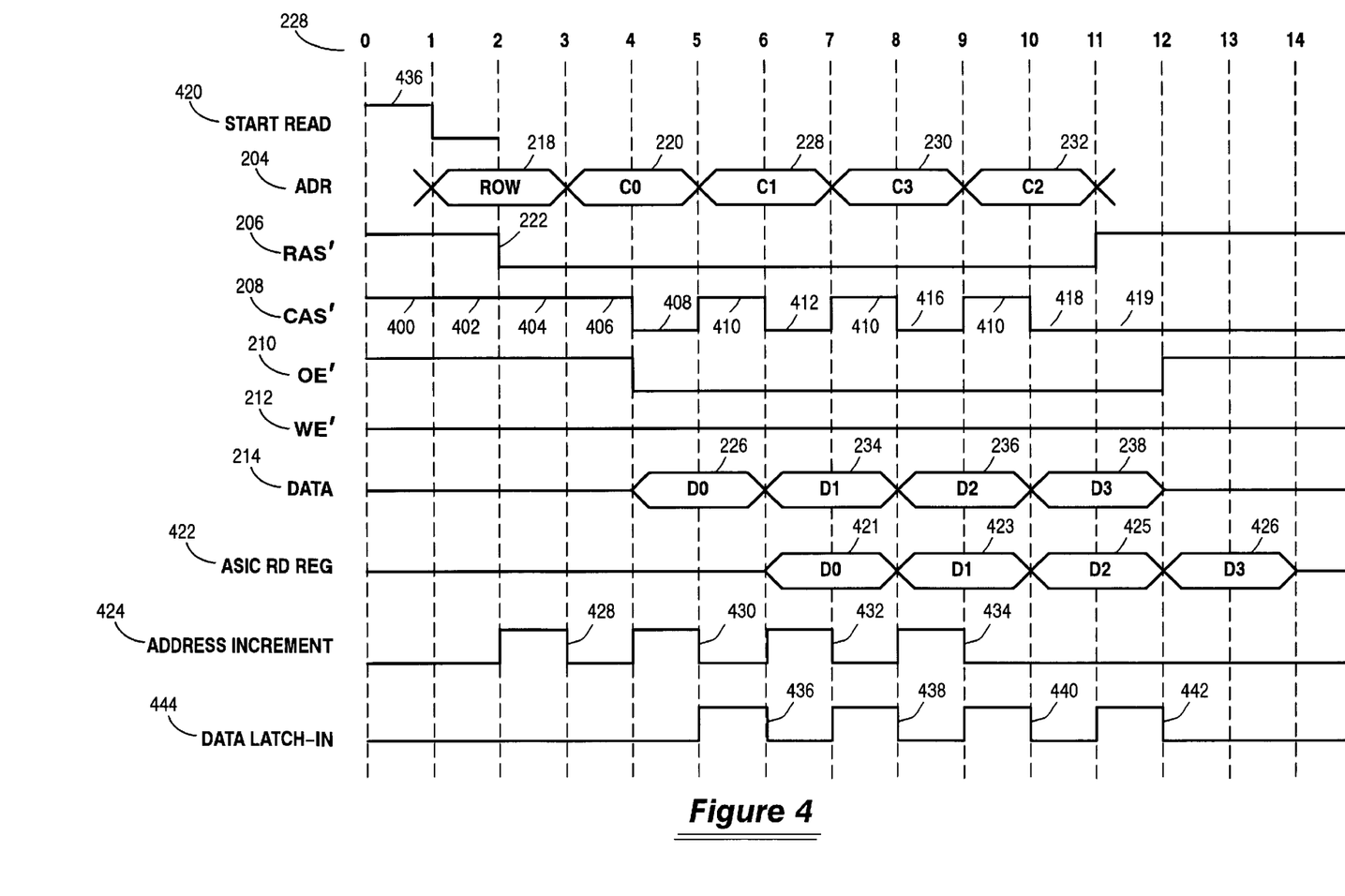
FIG. 4 is a typical timing diagram depicting a nominal read control sequence for a DRAM device, including control signals generated by an implementation of the present invention.

For example, referring to FIG. 4, a read control sequence is depicted. Note that the sequence depicted in FIG. 4 is the same read sequence as previously described and depicted in FIG. 1. However, several additional signals have been added to order to describe aspects of the present invention. For example, the Start Read signal 420 represents the Start Read control signals 546 used to initiate the read sequence depicted in FIG. 4. Thus when the Start read signal 420 goes active (high logic level) 436, the ASIC 310 loads each of the shift registers in each of the control waveform generators 311, 314, 316, and 318. Because this is a Start Read operation 420, the values loaded into each of the preceding shift registers is the value stored in each of the corresponding read registers (such as the read register 504 associated with the CAS' waveform generator 311). Then, beginning with the next system clock pulse 228-1 each of the control signal waveforms RAS' 206, CAS' 208, OE 210 and WE' 212 are generated by the shifting of the shift registers from each of the waveform generators 314, 311, 316 and 318.

As stated, each of the control lines, CAS' 322, RAS' 324, OE' 326 and WE' 328 are driven by a waveform generator, such as the CAS' waveform generator 311 depicted in FIG. 5. Thus, each control signal has a set of associated registers 504, 506 and 508 (hereinafter referred to as 'mode registers'), which define the desired waveforms for each mode of operation. In this example, since three modes of operation are possible, each waveform generator comprises three mode registers, a read, a write and a refresh register. In order to determine what value to store in each mode register, a timing diagram, such as the timing diagram in FIG. 4, is used for each mode of operation.

For example, the timing diagram in FIG. 4, depicts the desired control signals for a particular DRAM. In this example, assume that for a particular implementation of the present invention, the DRAM associated with the timing diagram in FIG. 4 is to be used in a computer system design. The following example illustrates how one would determine the programmable value to be stored in the CAS' read mode register 504, based on the timing diagram in FIG. 4. Specifically, this value is determined from the nominal CAS' waveform 208.

In this case, a 4 word page mode read operation is depicted. Note that each waveform depicted in the timing diagram in FIG. 4 can be expressed in terms of 1's and 0's, where a 1 represents a high logic level and a 0 represent a low logic level. Referring to the CAS' waveform 208, it can be seen that the waveform 208 can be represented by the binary value '11101010100'. This is derived by examining the logic level from the clock pulse 228-1 to the clock pulse 228-11. Thus the wave segment 402 corresponds with a value of '1'. Likewise the segment 404 corresponds with a value of '1'. Similarly the segment 406 corresponds with a value of '1' and segment 408 corresponds with a value of '0'. In this fashion the other segments 410, 412, 414, 416, 418, and 419, corresponds with '1010100'. Thus, the complete value representing the segments 402-419 is the value '11101010100'. This is the value that is pre-programmed or stored into the read mode register 504 within the CAS' waveform generator 311.

Note that the preceding value must be reversed since the shift register is shifted to the right in this example implementation of the present invention. Referring to FIG. 5, assume that the shift register 560 has just been loaded with the programmable value from the read register 504. Since the rightmost bit 512 is shifted out first, (i.e. it occurs first in time, 228-1), the bit 512 is programmed with a value represented by the leftmost segment 402 of the CAS' waveform 208. Similarly the value in the bit position 514 corresponds with 404, the value in the bit position 516 corresponds with 406 and the value in the bit position 518 corresponds with 408. In this fashion, the entire waveform, from the segment 402, to the segment 419 is represented in the shift register 560 within the bit positions 512 to 532.

Thus, the programmed value for the CAS' read mode register 504 is determined by simply examining a timing diagram, such as the timing diagram depicted in FIG. 4. The read register values for the other control signals, namely RAS' 206, OE' 210, and WE' 212 are derived in a similar fashion from the timing diagram depicted in FIG. 4. These values are stored in each of the read mode registers corresponding with each of the waveform generators, RAS' 314, OE' 316, and WE' 318. Likewise, values for the plurality of the write mode registers, such as write mode register 506, are determined from a different timing diagram (not shown) depicting a write data sequence. Finally, the values for the plurality of refresh registers, such as the refresh register 508, are determined from a different timing diagram (not shown) depicting a refresh sequence.

Thus, any desired timing sequence can be programmed via the programmned values assigned to each of the registers within each of the waveform generators. Consequently, the same embodiment of the present invention can be used to control a plurality of memory devices, each having different clock timing control signals and specifications. Further, changes to other system board components, and clock frequencies, and the like can all be compensated for by providing different programed values to the mode registers of the present invention. Typically, the programmed values are stored in each register at system initialization. Such values remain constant during normal operations of a computer system.

The two other functional components of the ASIC, namely the address controller component 334, and the data controller component 338 will now be described. The address controller component 334 serves to generate the row and column addresses for the DRAM 332. The addresses are transmitted over the address lines 320. The functions provided by the address component 334 are similar to those provided by conventional DRAM controllers, such as the DRAM controller 110. For example, an address multiplexing function as previously described, which time multiplexes the address from the address bus 304 into a row and column address transmitted over the address bus 320, is performed by the address controller 334.

Additionally, however, the address controller 334 generates an address increment signal 424. The address increment signal 424 is used internally by the ASIC 310 to trigger a transition from the row address 218 to the column address 220 and to the successive column addressess 228, 230 and 232. As can be seen such address transitions occur upon each falling edge 428, 430, 432, and 434 of the address increment signal 424.

The address increment signal waveform is generated in exactly the same manner as the other control signals, via a waveform generator, such as the waveform generator 311 depicted in FIG. 5. The only difference between the address increment waveform generator and the other waveform generators as previously discussed, is that the address increment waveform 424 is not driven out of the ASIC 310. Instead the address increment waveform 424 is used internally by the ASIC to coordinate its address multiplex timings in relation to the other control signals RAS' 206, CAS' 208, OE' 210 and WE' 212.

By using this method the address increment waveform is 424 is as highly flexible and programmable as each of the control waveforms, as previously discussed. Further, other internal signals may be generated in a similar fashion as needed by specific implementations of the present invention. Another internal signal used in this example implementation of the present invention is the data latch-in signal 444 which is described below.

The data controller component 338 functions as a buffer register between the data bus 308 and the data bus 330. The data register 338 is used to capture the data being read from the DRAM 332 during a read operation. As can be seen by the timing diagram in FIG. 4, the data is latched into the ASIC data register 338 two clock cycles after the data appears on the data bus 330. For example, data DO 226 appears on the data bus 330 at 228-4. This data DO 421, is latched into the data register 308 upon the falling edge 436 of the internal data latch-in signal 444. This is the earliest time in which a requester 302 can gain access to the data word 421 within the ASIC data register 338. Likewise data words D1 234, D2 236 and D3 238 are all latched into the ASIC data register 338, upon the falling edges, 438, 440 and 442 of the data latch-in signal 444, as depicted by the data words 423, 425 and 426, respectively.

Note that during write operations, the data register 338 is used as a buffer between the data bus 308 and the data bus 330 in order to control the flow of data between the DRAM 332 and the requestor 302. In this case, another internally generated waveform, similar to the data latch-in signal 444 is used to gate-out the data from the data register 338, so that it is available to the requestor 302 via the data bus 308.

Many other variations of embodiments and implementations of the present invention are possible without departing from the principles disclosed herein. While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A programmable memory controller for producing control signals necessary for controlling a memory device, the programmable memory controller comprising for each of the control signals produced:

a plurality of programmable mode registers each storing a value representing a waveform corresponding to an operating mode of one of the control signals;

a multiplexer to which said plurality of programmable mode registers are coupled as inputs; and     a shift register to which said multiplexer is coupled as an input.

2. The programmable memory controller of claim 1, wherein said shift register includes a plurality of bit positions each capable of storing one bit of data, said shift register being shifted synchronously with a clock signal to thereby generate the programmable control signal as an output.

3. The programmable memory controller of claim 1, wherein said plurality of mode registers comprise a mode register for each operating mode of the memory device.

4. The programmable memory controller of claim 3, wherein each said programmable operating mode waveform value stored within each of said plurality of mode registers represents the programmable control signal corresponding to the operating mode associated with said mode register.

5. The programmable memory controller of claim 3, wherein said multiplexer has each of said plurality of mode registers and a shift value coupled as an input to said multiplexer.

6. The programmable memory controller of claim 5, wherein said shift value is a '1'.

7. The programmable memory controller of claim 5, wherein said shift value is a '0'.

8. The programmable memory controller of claim 2, wherein said shift register shifts from left to right; wherein a shift value is loaded into the leftmost bit position by said multiplexer.

9. The programmable memory controller of claim 2, wherein said shift register shifts from right to left; wherein a shift value is loaded into the rightmost bit position by said multiplexer.

10. The programmable memory controller of claim 2, wherein said programmable operating mode waveform value is stored into said shift register in parallel under control of said multiplexer.

11. The programmable memory controller of claim 10 wherein said programmable value is stored into said shift register at the beginning of an operating mode control sequence to access memory.

12. The programmable memory controller of claim 11, wherein said shift value is synchronously stored into said shift register upon each clock signal, except when said programmable value is being stored into said shift register.

13. A programmable memory controller used to generate a plurality of waveform control signals for controlling access to a memory device, the memory controller comprising:
  a plurality of shift registers each being shifted synchronously with a clock signal to thereby generate the waveform control signals;
  a plurality of multiplexers, each of said plurality of multiplexers coupled as an input with a respective one of said plurality of shift registers;
  a plurality of mode registers each coupled with an associated one of said plurality of multiplexers, each said mode register having a programmable operating mode waveform value stored therein, said programmable operating mode waveform value defining one operating mode for one waveform control signal to be generated by an associated one of said plurality of shift registers; and
  a controller coupled with said plurality of multiplexers, wherein said controller selects a load value from one of said programmable operating mode waveform values, said load value being loaded into an associated one of said plurality of shift registers and shifted out by said clock signal.

14. The programmable memory controller of claim 13, wherein said load value comprises a programmable value at the beginning of an operating mode control sequence.

15. The programmable memory controller of claim 13, wherein said load value comprises a one bit shift value when not at the beginning of an operating mode control sequence.

16. The programmable memory controller of claim 13, wherein said programmable operating mode waveform value stored in an associated one of said mode registers is loaded into said shift register in parallel.

17. The programmable memory controller of claim 15, wherein said one bit shift value is loaded into a bit position at a first end of said shift register.

18. The programmable memory controller of claim 17, wherein a second end of said shift register is coupled as an output with a driver, whereby said driver drives the plurality of waveform control signals from the programmable memory controller for accessing the memory device.

19. A method of controlling a memory device in a computer system using a programmable memory controller, said method comprising the steps of:
  (1) deriving a digital programmable waveform value for each desired control signal for each operating mode of the memory device;
  (2) loading the digital programmable waveform values into a mode register of said memory controller for each said programmable value;
  (3) transferring in parallel the waveform contents of each said mode register associated with each control signal into a shift register within said memory controller during the initial program loading process for the computer system; and
  (4) serially shifting the waveform contents out of said shift registers using the system clock of said computer system to provide a plurality of control signals for accessing said memory device.

20. A programmable memory controller capable of generating different programmable control signals used for controlling at least read and write operating modes of a memory device, the memory controller comprising:
  a read and a write waveform generation means for generating the programmable control signals applied to said memory device comprising:
    mode register storing means for storing programmable waveform values comprising read and write operating mode values;
    programmable storing and shifting means for receiving said operating mode waveform values and producing said control signals;
    parallel gating means coupled between said mode register storing means and said programmable storing and shifting means for gating one said programmable waveform values into said programmable storing and shifting means;
    control means coupled to said gating means for controlling said gating means to select between said programmable waveform values and to shift said selected operating mode values out of said programmable storing and shifting means to provide said controls signals for accessing said memory device;
    wherein said programmable storing and shifting means comprises a shift register having a plurality of bit positions each capable of storing one bit of data, said shift register being shifted synchronously with a clock signal to thereby generate the control signal as an output;
    wherein said programmable value is stored into said shift register in parallel under control of said gating means;

wherein said programmable value is stored into said shift register at the beginning of an operating mode control sequence to access memory; and wherein said shift value is synchronously stored into said shift register upon each clock signal, except when said programmable value is being stored into said shift register.

21. A programmable memory controller capable of generating different programmable control signals used for controlling at least read and write operating modes of a memory device, said memory controller comprising:

a read and write waveform generator that generates the programmable control signals applied to the memory device comprising:

a plurality of mode registers that store programmable operating mode waveform values, said plurality of mode registers comprising at least a read register that stores a read waveform value; and a write register that stores a write waveform value;

a shift register that receives said programmable operating mode waveform values;

a multiplexer coupled between said plurality of mode registers and said shift register that gates one of said programmable operating mode waveform values into said shift register; and a controller coupled to said multiplexer that controls said multiplexer to select between said programmable operating mode waveform values.

22. A programmable memory controller capable of generating programmable control signals used for controlling at least read and write operating modes of a memory device, the memory controller comprising:

a read and write waveform generator that generates the programmable control signals applied to the memory device comprising:

mode registers that store programmable operating mode waveform values, said mode registers comprising at least a read register that stores a read waveform value; and a write register that stores a write waveform value;

a shift register that receives said programmable operating mode waveform values, said shift register having a plurality of bit positions in which bits of said programmable operating mode waveform value are stored and then shifted synchronously by a clock signal thereby generating the control signals, a multiplexer coupled between said mode registers and said shift register that gates one of said programmable operating mode waveform values into said shift register; and a controller coupled to said multiplexer that controls said multiplexer to select one of said programmable operating mode waveform values.

* * * * *